United States Patent [19]
Keller et al.

[11] Patent Number: 5,457,062
[45] Date of Patent: Oct. 10, 1995

[54] METHOD FOR FORMING GIGAOHM LOAD FOR BICMOS PROCESS

[75] Inventors: Stephen A. Keller, Sugarland; Rajiv R. Shah, Richardson, both of Tex.

[73] Assignee: Texas Instruments Incorporated, Dallas, Tex.

[21] Appl. No.: 300,580

[22] Filed: Sep. 2, 1994

Related U.S. Application Data

[63] Continuation of Ser. No. 18,354, Feb. 16, 1993, abandoned, which is a continuation of Ser. No. 738,029, Jul. 30, 1991, abandoned, which is a division of Ser. No. 375,080, Jun. 19, 1989, Pat. No. 5,047,826.

[51] Int. Cl.$^6$ .................................................. H01L 21/265
[52] U.S. Cl. .................. 437/47; 437/52; 437/57; 437/59; 437/60; 437/918; 148/DIG. 136
[58] Field of Search .................. 257/66, 67, 69, 257/351, 379, 380; 437/47, 52, 57, 59, 60, 918; 148/DIG. 136

[56] References Cited

U.S. PATENT DOCUMENTS

| | | | |
|---|---|---|---|
| 4,001,762 | 1/1977 | Aoki et al. | 437/60 |
| 4,208,781 | 6/1980 | Rao et al. | 437/60 |
| 4,370,798 | 2/1983 | Lien et al. | 437/918 |
| 4,408,385 | 10/1983 | Mohan Rao et al. | 437/918 |
| 4,419,812 | 12/1983 | Topich | 437/47 |
| 4,579,600 | 4/1986 | Shah et al. | 148/1.5 |
| 4,679,170 | 7/1987 | Bourassa et al. | 365/154 |
| 4,682,402 | 7/1987 | Yamaguchi | 148/DIG. 136 |
| 4,737,838 | 4/1988 | Watanabe | 357/65 |
| 4,762,801 | 8/1988 | Kapoor | 437/27 |
| 4,971,924 | 11/1990 | Tigelaar et al. | 437/60 |
| 5,013,678 | 5/1991 | Winnerl et al. | 437/918 |
| 5,047,826 | 9/1991 | Keller et al. | 357/42 |
| 5,077,226 | 12/1991 | Youn et al. | 437/31 |
| 5,135,888 | 8/1992 | Chan et al. | 437/59 |
| 5,196,233 | 3/1993 | Chan et al. | 437/52 |

FOREIGN PATENT DOCUMENTS 0171230  7/1989  Japan ........................ 437/47

Primary Examiner—Olik Chaudhuri
Assistant Examiner—Long Pham
Attorney, Agent, or Firm—W. James Brady, III; Richard L. Donaldson

[57] ABSTRACT

An integrated circuit including a high value resistor (17d) is formed by using an amorphous silicon layer. The amorphous silicon layer may also be used to form the second plate (34) of a capacitor (17c) and a fuse (30). In the second embodiment of the invention, the amorphous silicon layer (92) is formed after the formation of the devices to avoid any additional high temperature cycles.

10 Claims, 5 Drawing Sheets

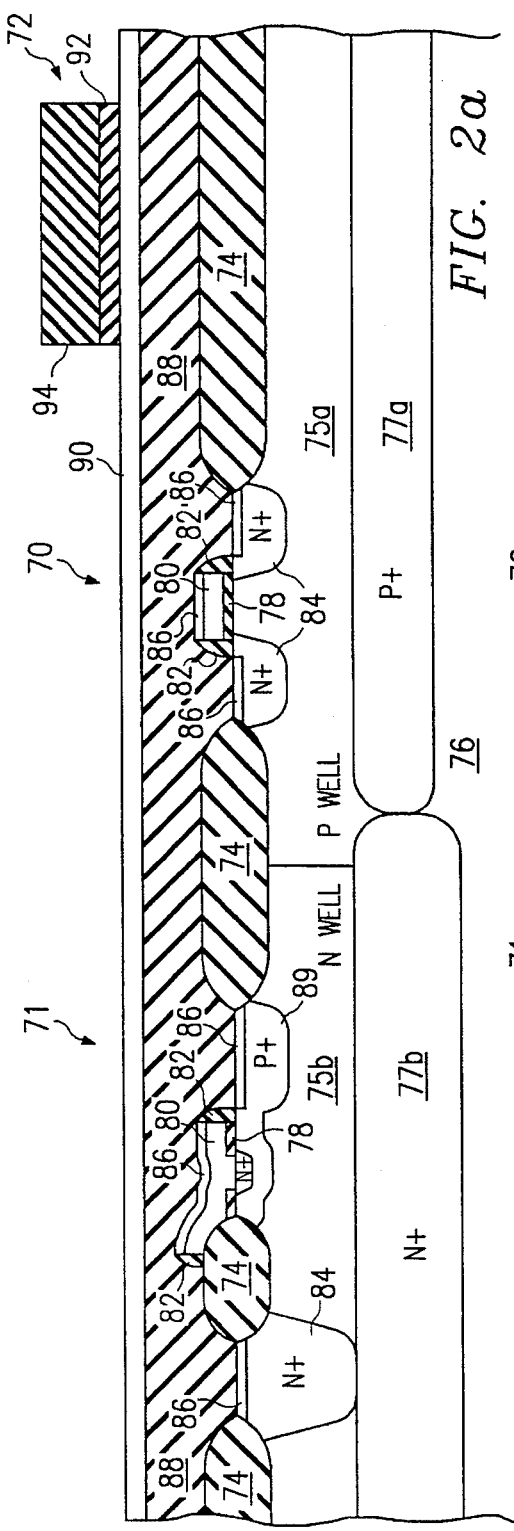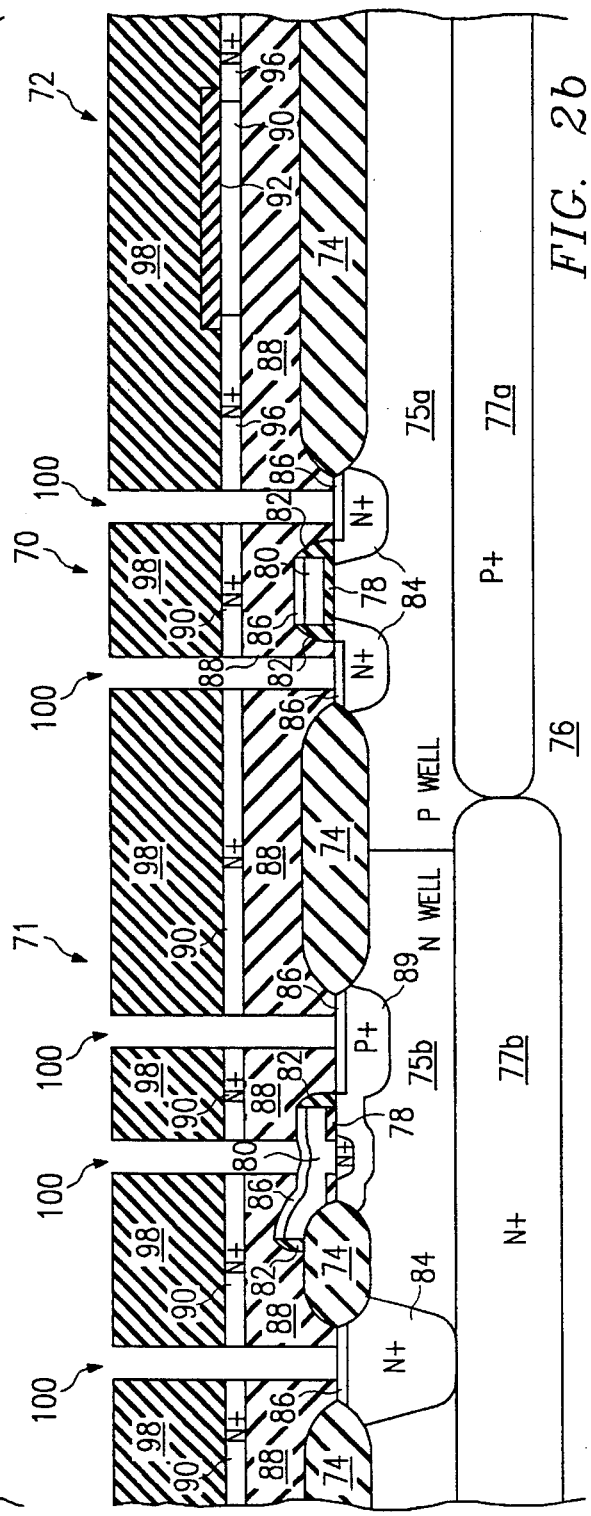

1

METHOD FOR FORMING GIGAOHM LOAD FOR BICMOS PROCESS

This application is a Continuation of application Ser. No. 018,354, filed Feb. 16, 1993, now abandoned, which is a Continuation of application Ser. No. 07/738,029, filed Jul. 30, 1991, now abandoned, which is a division of application Ser. No. 07/375,080, filed Jun. 30, 1989, now U.S. Pat. No. 5,047,826.

TECHNICAL FIELD OF THE INVENTION

This invention relates in general to integrated circuits, and more particular to a gigaohm load resistor suited for use in an advanced silicided BiCMOS process or advanced silicided CMOS.

BACKGROUND OF THE INVENTION

In many integrated circuit applications, a highly resistive load is needed to implement the circuit. One such example is a static RAM (SRAM) circuit. Of particular importance, the 4-transistor, 2-resistor SRAM cell (4T-2R cell) requires a resistive load in the gigaohm range.

Resistive loads in the gigaohm range are difficult to fabricate. One such method of forming a gigaohm resistive load requires a polysilicon deposition which is dedicated solely to forming the load resistors. Consequently, several steps, including at least one masking step, are required solely for the formation of the gigaohm resistors. As a general rule, each masking step increases the complexity of the fabrication process, and reduces the yield due to the increased likelihood of misalignment. This increased complexity is particularly troublesome in high density circuits such as SRAM memory cells.

Often, memory cells arrays are made using a CMOS or bipolar process which implements either all bipolar or all CMOS devices in a single integrated circuit. BiCMOS processes tend to be less efficient in the number of steps than either a bipolar only or CMOS only process. Therefore, it is particularly important in a BiCMOS process to reduce the number of steps and the number of masks in order to optimize fabrication of the circuit.

Therefore, a need has arisen to provide a highly resistive load which requires minimal additional steps, particularly in connection with a BiCMOS process.

SUMMARY OF THE INVENTION

In accordance with the present invention, an integrated circuit including a resistor in the gigaohm range is provided which substantially eliminates or prevents disadvantages associated with prior integrated circuits.

In the first embodiment of the present invention, a first conductive layer is disposed over a semiconductor substrate. The first layer is etched to form the first plate of a capacitor and the gates of the MOS transistors. A dielectric layer is disposed over the first conductive layer and a second layer having a high resistive value is disposed over the dielectric layer. Portions of the second layer are removed to define the second plate of the capacitor and the body of the resistor. The second conductive layer can also be used to define a fuse. In the preferred embodiment, the first conductive layer comprises a polysilicon layer and the second conductive layer comprises a layer of amorphous silicon.

This embodiment of the present invention provides the advantages that a resistor in the gigaohm range can be provided on an integrated circuit with a single additional masking step. Further, a PtSi Schottky diode may be fabricated in conjunction with the aforementioned steps without any additional masking levels.

In the second embodiment of the present invention, a plurality of devices are formed on a semiconductor substrate. An insulating layer is disposed over the devices and a highly resistive layer, such as amorphous silicon, is formed over the insulating layer. The body of the resistor is masked using an oxide layer, and one or more metal layers is disposed over the amorphous silicon. Windows to contact the devices are formed through the amorphous silicon layer and the insulating layer. Thereafter, the leads and the resistor are defined by removing portions of the metal layers and the amorphous silicon layer.

This embodiment of the present invention provides the technical advantage that a high value resistor may be provided with a single masking step. Further, this embodiment of the invention avoids high temperature cycles after formation of the devices.

BRIEF DESCRIPTION OF THE DRAWINGS

For a more complete understanding of the present invention and the advantages thereof, reference is now made to the following descriptions taken in conjunction with the accompanying drawings, in which:

FIG. 2a illustrates a second embodiment of the present invention after a first processing stage;

FIG. 2b illustrates the second embodiment of the present invention after a second processing stage.

DETAILED DESCRIPTION OF THE INVENTION

The preferred embodiment of the present invention is best understood by referring to FIGS. 1–2 of the drawings, like numerals being used for like and corresponding parts of the various drawings.

Figure 1A:
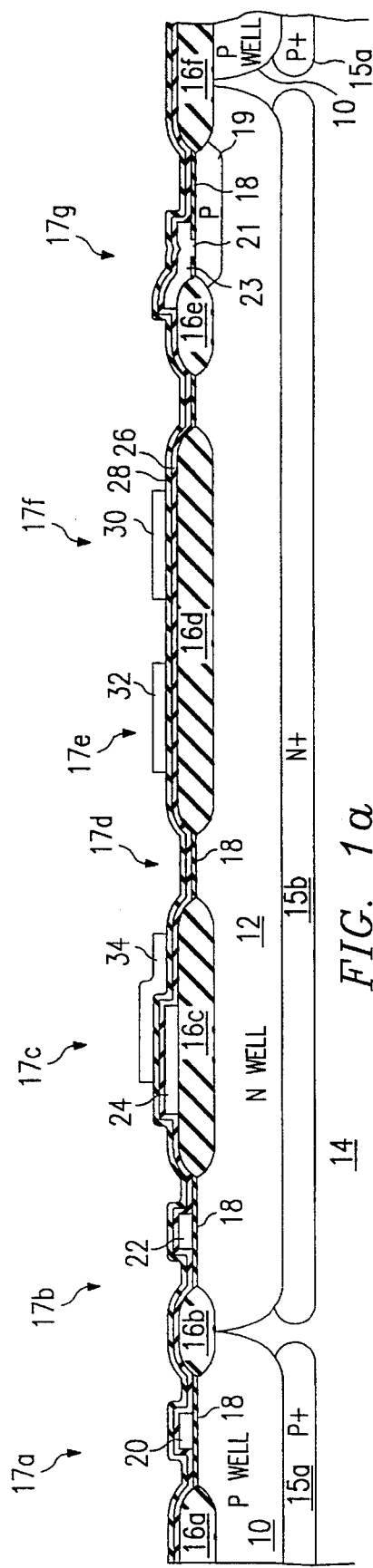
FIG. 1a illustrates a cross-sectional side view of a first embodiment of the present invention, including a load resistor, capacitor, Schottky diode, and silicon fuse, after a first processing stage.

FIG. 1a illustrates a cross-sectional side view of the present invention after a first processing stage. P wells 10 and N wells 12 are formed in a substrate 14, typically a P type silicon substrate over P+ and N+ buried regions 15a–b.

Field oxide regions 16a-f are formed by exposing portions of the substrate 14 through a nitride mask and subjecting the substrate to a high temperature oxidation cycle. The field oxide regions define areas for a NMOS transistor 17a, PMOS transistor 17b, capacitor 17c, Schottky diode 17d, resistor 17e, fuse 17f and bipolar transistor 17g. The nitride layer subsequently is removed and a gate oxide layer 18 is formed between the field oxide region 16a-b and a thin polysilicon layer is deposited. The base region 19 for the bipolar transistor 17g is formed by implantation and diffusion of a suitable dopant. A window 21 is formed in the polysilicon layer over the base region 19. Another polysilicon layer is formed over the first polysilicon layer and field oxide regions 16. The polysilicon layer is subsequently doped and etched to form the gate 20 on NMOS transistor, the gate 22 of a PMOS transistor, the poly emitter 23 of the bipolar transistor and the first plate 24 of a capacitor.

A thin oxide layer 26, having a thickness of approximately 100–150 angstroms, is formed over the structure. A thin nitride layer 28 is deposited over the thin oxide layer 26. An amorphous silicon layer is formed over the structure and is subsequently etched to form the fuse body 30, the load resistor body 32, and the second plate 34 of the capacitor 17c. In an alternative embodiment, a pure oxide layer replaces the oxide layer 26 and nitride layer 28.

Figure 1B:
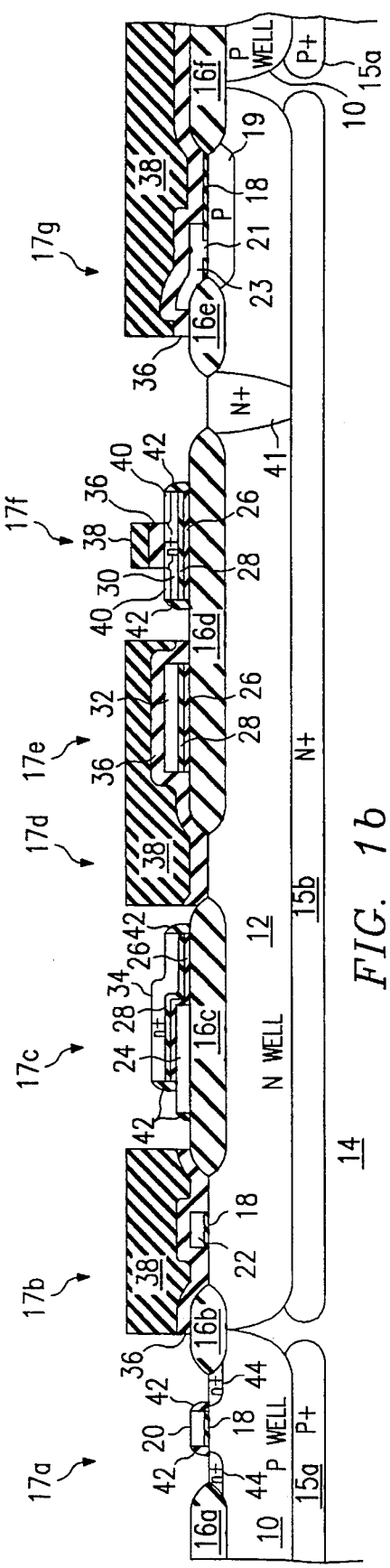
FIG. 1b illustrates a cross-sectional side view of the first embodiment of the present invention, including a load resistor, capacitor, Schottky diode, and silicon fuse, after a second processing stage.

FIG. 1b illustrates the first embodiment of the present invention after a second processing stage. A wet etch is used to remove the oxide and nitride layers 26 and 28 where they are not covered by the amorphous silicon, namely, below load resistor body 32, fuse body 30, and second plate 34. Alternatively, the oxide and nitride layers may be left and incorporated into the sidewall spacers (described below). An oxide layer 36 of approximately 2500 angstroms is formed over the structure, preferably using a TEOS oxide. A photoresist mask 38 is formed over this structure and patterned to expose the source/drain regions of the NMOS transistor 17a, the capacitor top plate 34, head regions 40 of the fuse 30 and the collector 41 of the bipolar transistor. Optionally, head regions of the resistor 32 may be exposed.

The TEOS oxide layer 36 is etched to form sidewall spacers 42 on the NMOS gate 20, the first and second plates 24 and 34 of the capacitor, and the fuse 30. An N+ implant is performed, forming N+ source/drain regions 44 and fuse heads 40. Thereafter, the masks 38 is removed.

Figure 1C:
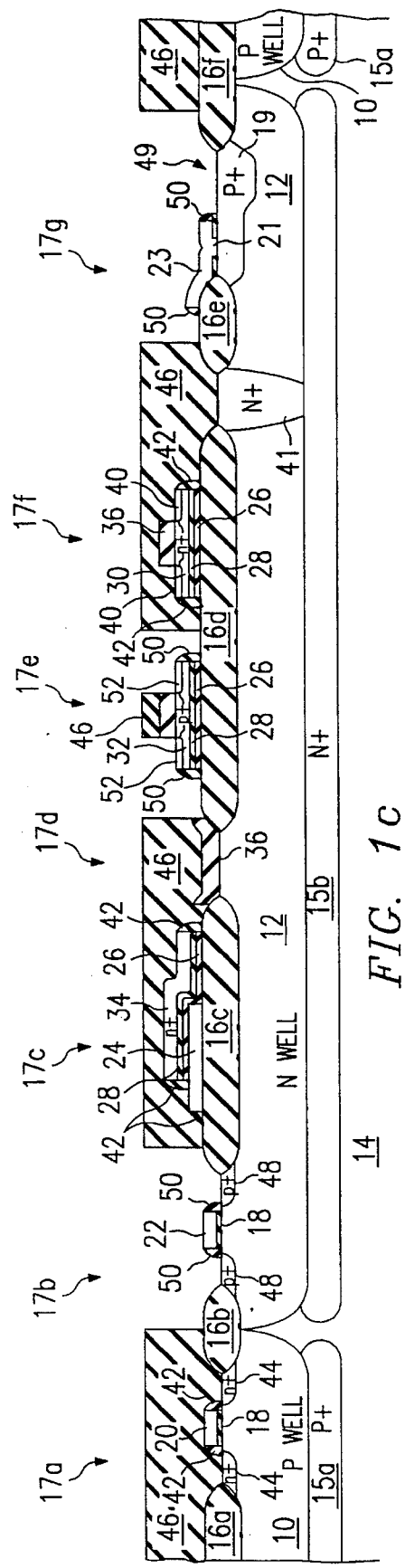
FIG. 1c illustrates a cross-sectional side view of the first embodiment of the present invention, including a load resistor, capacitor, Schottky diode, and silicon fuse, after a third processing stage.

FIG. 1c illustrates a cross-sectional side view of the first embodiment of the present invention after a third processing stage. The masks 38 are removed from the structure using a photoresist etch and a second mask 46 is formed over the structure to expose the P+ source/drain 48 of the PMOS transistor, the poly emitter 23, the extrinsic base 49 of the bipolar transistor 17g and the head regions 52 of the load resistor 32. The remaining portions of the TEOS oxide layer 36 are removed using an anisotropic etch, thereby forming sidewall spacers 50. A P+ source/drain implant is performed, forming source/drain regions 48, P+ header regions 52 on the load resistor 32 and the extrinsic base of the bipolar transistor 17g.

Figure 1D:
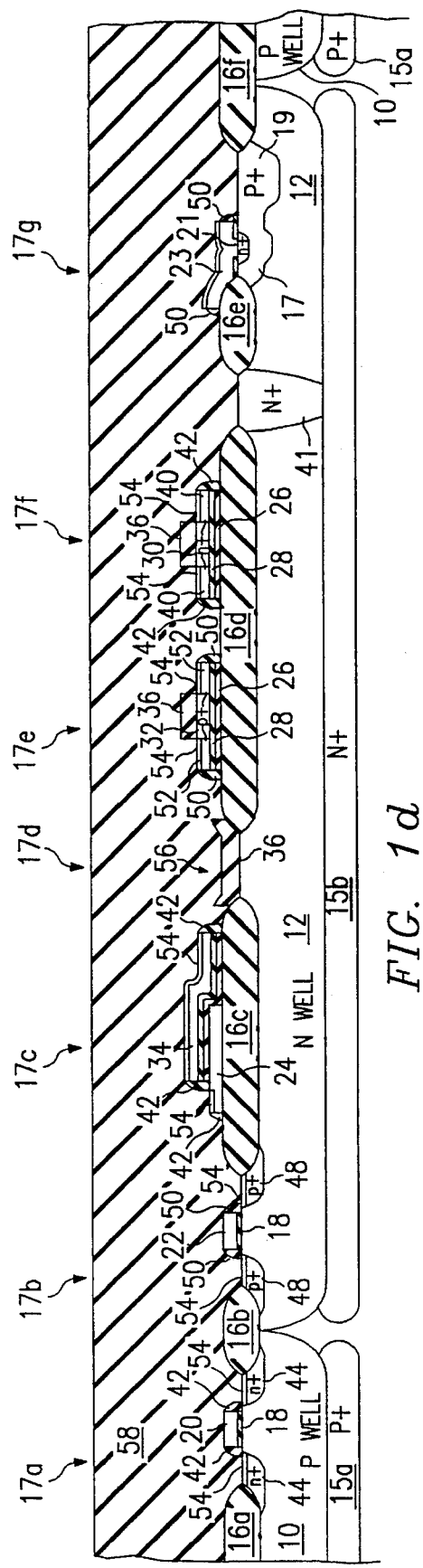
FIG. 1d illustrates a cross-sectional side view of the first embodiment of the present invention, including a load resistor, capacitor, Schottky diode, and silicon fuse, after a fourth processing stage.

FIG. 1d illustrates a cross-sectional side view of the first embodiment of the present invention after a fourth processing stage. After removing the mask 46, the exposed silicon and polysilicon surfaces are silicided, typically by depositing a metal layer, such as titanium, sintering the metal layer, and stripping the excess metal. Silicided regions 54 are thus formed over the N+ source/drain regions 44, the P+ source/drain regions 48, the poly emitter 23, collector 41 and extrinsic base 49 of the bipolar transistor, the first and second plates 24 and 34 of the capacitor, the resistor heads 52 and the fuse heads 40. It should be noted that the remaining portions of the TEOS layer 36 cover the load resistor body 32 and fuse 30, as well as the moat region 56 preserved for PtSi Schottky diode formation. A thick oxide layer 58 is formed over the structure and is optionally planarized to provide a level surface for subsequent metallization.

Figure 1E:
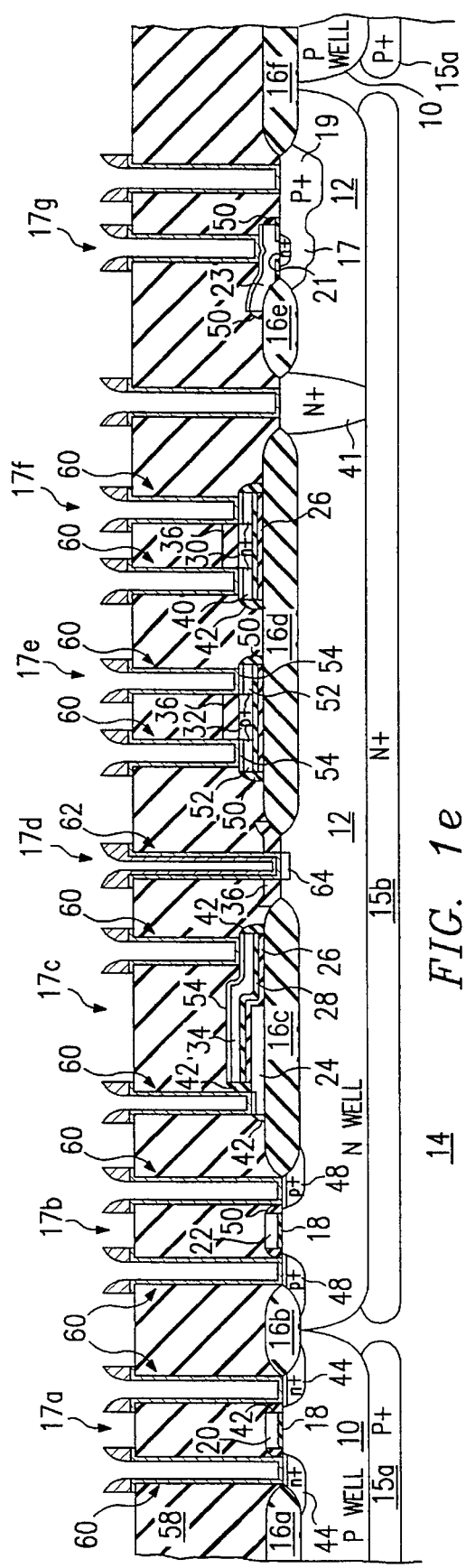
FIG. 1e illustrates a cross-sectional side view of the first embodiment of the present invention, including a load resistor, capacitor, Schottky diode, and silicon fuse, after a fifth processing stage.

FIG. 1e illustrates a cross-sectional side view of the present invention after a fifth processing stage. After planarizing the thick oxide layer 58, windows 60 are opened in the thick oxide layer 58, including a window 62 for a Schottky diode. A platinum deposition is performed, followed by a sinter and excess platinum strip. PtSi regions will be formed at the bottom of all the windows; for illustration purposes, only the PtSi region 64 at the bottom of the Schottky window 62 is shown. Thereafter, metallization layers 66 and 68 are deposited over the structure to form the interconnects. In the preferred embodiment, metallization layer 66 comprises a TiW layer and layer 68 comprises a AlCu layer. The metalization layer 66 and 68 are patterned and etched to form the leads.

The present invention provides several significant advantages over the prior art. Formation of the load resistor, capacitor and fuse requires only one additional masking level to pattern the amorphous silicon layer. The PtSi Schottky diode is fabricated without any additional masking levels. The oxide layer 36 covering the load resistor body 32, polysilicon fuse neck 30, and Schottky diode moats prevents silicide formation on these regions.

It should be noted that although the resistor heads 52 and fuse heads 40 were doped P+ and N+, respectively, in the illustrated embodiment, either doping type may be used as desired.

Figure 2C:
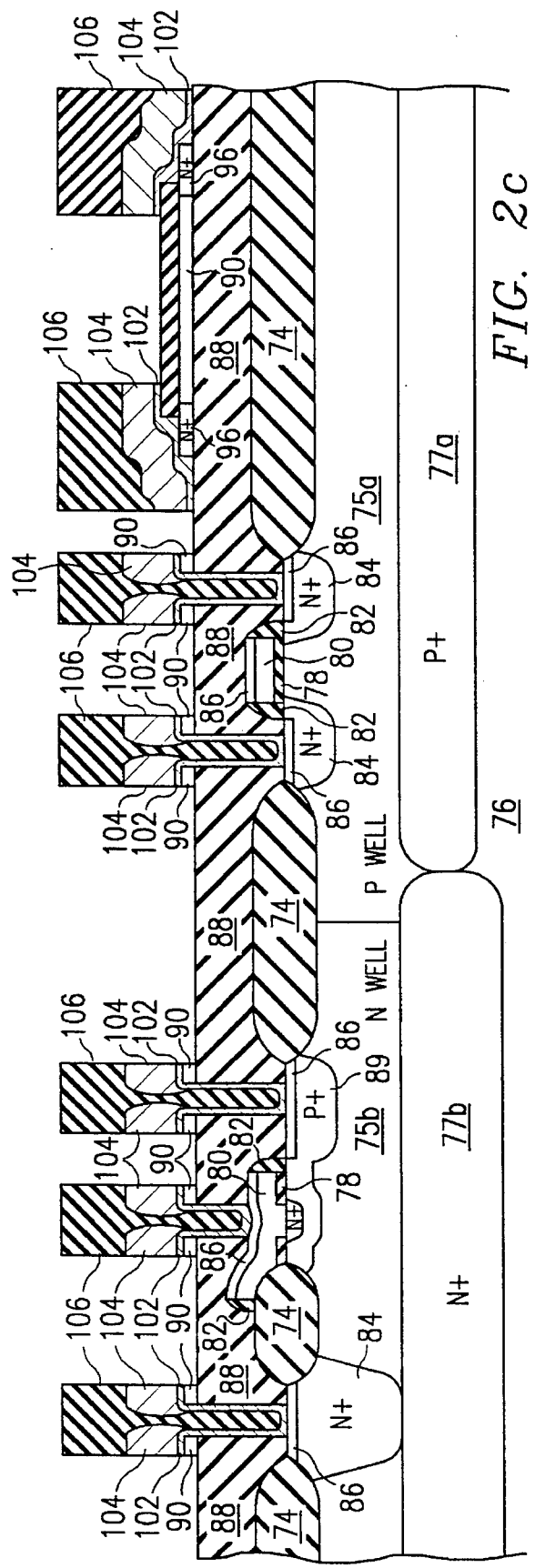
FIG. 2c illustrates the second embodiment of the present invention after a third processing stage.

FIGS. 2a–c illustrate a second embodiment of the present invention. FIG. 2a illustrates a cross-sectional side view of the second embodiment of the present invention after a first processing stage. For purposes of illustration, the process is shown in connection with the fabrication of an NMOS transistor 70, NPN bipolar transistor 71, and a gigaohm load resistor 72. The NMOS transistor 70 is fabricated using standard processing techniques. In short, field oxide regions 74 are formed P wells 75a and N wells 75b disposed in a substrate 76. P wells 75a and N wells 75b are formed over P+ and N+ buried regions 77a and b, respectively. Gate oxide layer 78 and polysilicon layer 80 are formed over the structure and are patterned and etched to define gates for the MOS transistors and a polysilicon emitter for the bipolar transistor 71. An oxide layer is deposited over the structure and is subsequently etched to form sidewall spacer regions 82. The N+ diffused regions 84 are implanted into the substrate 76 to form source/drains for the MOS transistors and collector regions for the bipolar transistor. Silicide regions 86 are formed over the diffused regions 84 and the gate 80 to provide a low resistance contact. An insulating layer 88 is formed over the structure and is planarized, if desired. The extrinsic base 89 of bipolar transistor 71 is formed along with other steps as outlined in connection with FIGS. 1a–e.

After planarizing the insulating layer 88, an amorphous silicon layer 90 is formed over the insulating layer 88. The amorphous silicon layer 80 of approximately 1500–2500 angstroms. The resistive value of the amorphous silicon layer 90 can be adjusted by implantation.

A thin oxide masking layer 92, having a thickness of approximately 1000–2000 angstroms, is formed over the amorphous silicon layer 90. A photoresist mask is patterned over the oxide layer 92 and an etch is performed on the thin oxide layer 92 stopping on the amorphous layer 90. Thereafter, the photoresist mask 94 is removed.

In FIG. 2b, the exposed amorphous silicon is doped with a P+ or N+ dopant to form the resistor heads 96. If desired, the exposed amorphous silicon may be also be silicided with platinum or another metal. The oxide layer 92 masks the amorphous silicon thereunder from the implantation and silicide formation. A masking layer 98 is formed over the structure to define windows 100 for the contacts and the exposed portions of the structure are etched.

In FIG. 2c, the masking layer 98 is removed and metal layers 102 and 104 are formed over the structure. In the preferred embodiment, metal layer 102 comprises TiW and metal layer 104 comprises AlCu. A mask 106 is formed over the second metal layer 104 to define the leads 108 to devices. After removal of the exposed metal layers 102 and 104 and amorphous silicon layer 90, the resistor 72 is defined.

This embodiment of the present invention requires only one additional masking level to pattern the oxide which covers the body of the load resistor 72. The load resistor heads can be doped either N+ or P+, as desired, and optionally silicided as well. Further, amorphous silicon fuses could be fabricated using this approach. A significant advantage of this approach is that the resistor can be fabricated without any high temperature cycles. Notably, the amorphous silicon layer can be formed by sputtering or low temperature CVD.

Although the present invention has been described in detail, it should be understood that various changes, substitutions and alterations can be made herein without departing from the spirit and scope of the invention as defined by the appended claims.

What is claimed is:

1. A method of forming an integrated circuit including a highly resistive amorphous silicon resistor, comprising the steps of:

forming a first conductive layer over a substrate;

removing portions of said first conductive layer to form a first plate of a capacitor;

forming a dielectric layer over said first conductive layer;

forming an amorphous silicon layer over said dielectric layer;

removing portions of said amorphous silicon layer to define a second amorphous silicon plate of said capacitor and the body of a highly resistive amorphous silicon resistor;

forming an insulator layer over a first portion of said highly resistive amorphous silicon resistor; and forming contacts in contact with second and third portions of said highly resistive amorphous silicon resistor.

2. The method of claim 1 wherein said step of removing portions of said amorphous silicon layer further includes defining a fuse.

3. The method of claim 1 and further comprising the steps of:

masking portions of said resistor body; and doping said second amorphous silicon plate of said capacitor and the unmasked portions of said resistor body.

4. The method of claim 2 and further comprising the steps of:

masking portions of said fuse; and doping said second amorphous silicon plate and the unmasked portions of said fuse.

5. The method of claim 4 wherein said doping step comprises doping said second amorphous silicon plate and the unmasked portions of said fuse with a dopant of a first conductivity type and further comprising the step of:

masking said fuse and said amorphous silicon second plate; and doping said resistor body with a dopant of a second conductivity type.

6. The method of claim 1 and further comprising the step of forming a mask over a portion of said substrate in which a diode is formed.

7. The method of claim 6 and further comprising the steps of siliciding portions of the resistor and said second amorphous silicon plate, the mask over said substrate operable to prevent silicidation over said diode portion of said substrate.

8. The method of claim 1 wherein said step of removing portions of said first conductive layer further includes the step of defining gates for one or more MOS transistors and polysilicon emitters for one or more bipolar transistors.

9. The method of claim 3 wherein said doping step further comprises doping source/drain regions for an MOS transistor.

10. The method of claim 9 wherein said doping step further comprises doping a collector region for a bipolar transistor.

\* \* \* \* \*